(12) United States Patent
Inomata et al.

(10) Patent No.: US 8,866,243 B2
(45) Date of Patent: Oct. 21, 2014

(54) FERROMAGNETIC TUNNEL JUNCTION STRUCTURE AND MAGNETORESISTIVE ELEMENT USING THE SAME

(75) Inventors: Koichiro Inomata, Ibaraki (JP); Wenhong Wang, Ibaraki (JP); Hiroaki Sukegawa, Ibaraki (JP)

(73) Assignee: National Institute for Materials Science, Ibaraki (JP)

( * ) Notice: Subject to any disclaimer, the term of this patent is extended or adjusted under 35 U.S.C. 154(b) by 163 days.

(21) Appl. No.: 13/321,956

(22) PCT Filed: May 7, 2010

(86) PCT No.: PCT/JP2010/057833
§ 371 (c)(1),
(2), (4) Date: Jan. 23, 2012

(87) PCT Pub. No.: WO2010/134435
PCT Pub. Date: Nov. 25, 2010

(65) Prior Publication Data
US 2012/0112299 A1 May 10, 2012

(30) Foreign Application Priority Data
May 22, 2009 (JP) ................................. 2009-123922

(51) Int. Cl.
| | | |
|---|---|---|
| H01L 29/82 | (2006.01) | |
| H01F 10/32 | (2006.01) | |
| G11B 5/39 | (2006.01) | |
| B82Y 25/00 | (2011.01) | |
| G01R 33/09 | (2006.01) | |
| B82Y 10/00 | (2011.01) | |
| H01L 43/08 | (2006.01) | |
| H01L 43/10 | (2006.01) | |

(52) U.S. Cl.
CPC .......... *G11B 5/3909* (2013.01); *H01F 10/3254* (2013.01); *G11B 5/3906* (2013.01); *B82Y 25/00* (2013.01); *G01R 33/098* (2013.01); *B82Y 10/00* (2013.01); *G11B 2005/3996* (2013.01); *H01L 43/08* (2013.01); *H01L 43/10* (2013.01)

USPC ................. 257/421; 257/295; 257/E21.002; 257/E29.323

(58) Field of Classification Search
USPC ................. 257/295, 421, E21.002, E29.323
See application file for complete search history.

(56) References Cited

U.S. PATENT DOCUMENTS

| | | |
|---|---|---|
| 2006/0044703 A1 | 3/2006 | Inomata et al. |
| 2006/0153432 A1 | 7/2006 | Lo et al. |

(Continued)

FOREIGN PATENT DOCUMENTS

| | | |
|---|---|---|
| JP | 2004-221526 | 8/2004 |
| JP | 2007-184082 | 7/2007 |

OTHER PUBLICATIONS

W. Butler et al., "Spin-dependent tunneling conductance of Fe|MgO|Fe sandwiches", Physical Review B, vol. 63, 054416, pp. 054416-1-0544416-12, 2001.

(Continued)

*Primary Examiner* — Andy Huynh
(74) *Attorney, Agent, or Firm* — Wenderoth, Lind & Ponack, L.L.P.

(57) ABSTRACT

For the present ferromagnetic tunnel junction structure, employed is a means characterized by using an MgO barrier and using a $Co_2FeAl$ full-Heusler alloy for any of the ferromagnetic layers therein. The ferromagnetic tunnel junction structure is characterized in that $Co_2FeAl$ includes especially a B2 structure and one of the ferromagnetic layers is formed on a Cr buffer layer. The magnetoresistive element is characterized in that the ferromagnetic tunnel junction structure therein is any of the above-mentioned ferromagnetic tunnel junction structure. Accordingly, a large TMR, especially a TMR over 100% at room temperature can be attained, using $Co_2FeAl$ having a smallest α though not a half-metal.

9 Claims, 7 Drawing Sheets

(56) References Cited

U.S. PATENT DOCUMENTS

2007/0153432 A1    7/2007    Sbiaa et al.
2009/0180215 A1*   7/2009    Ishikawa et al. .............. 360/313

OTHER PUBLICATIONS

K. Inomata et al., "Structural and magnetic properties and tunnel magnetoresistance for $Co_2(Cr,Fe)Al$ and $Co_2FeSi$ full-Heusler alloys", Journal of Physics D: Applied Physics, vol. 39, pp. 816-823, 2006.

S. Ishida et al., "Theoretical Predict of Half-Metals in Co—Cr—Fe—Al Alloys", Materials Transactions, vol. 45, No. 4, pp. 1065-1069, 2004.

Y. Miura et al., "Coherent tunneling conductance in magnetic tunnel junctions of half-metallic full Heusler alloys with MgO barriers", Journal of Physics: Condensed Matter, vol. 19, pp. 1-7, 2007.

J. Moodera et al., "Large Magnetoresistance at Room Temperature in Ferromagnetic Thin Film Tunnel Junctions", Physical Review Letters, vol. 74, No. 16, pp. 3273-7276, Apr. 17, 1995.

Y. Sakuraba et al., Giant tunneling magnetoresistance in $Co_2MnSi$/Al—O/$Co_2MnSi$ magnetic tunnel junctions, Applied Physics Letters, vol. 88, 192508, pp. 192508-1-192508-3, 2006.

N. Tezuka et al., "Giant Tunnel Magnetoresistance at Room Temperature for Junctions using Full-Heusler $Co_2FeAl_{0.5}Si_{0.5}$ Electrodes", Japanese Journal of Applied Physics, vol. 46, No. 19, pp. L454-L456, 2007.

C. Tiusan et al., "Static and dynamic aspects of spin tunneling in crystalline magnetic tunnel junctions", Journal of Physics: Condensed Matter, vol. 18, pp. 941-956, 2006.

International Search Report issued Jul. 13, 2010 in International (PCT) Application No. PCT/JP2010/057833, of which the present application is the national phase.

* cited by examiner (a)

(b)

FERROMAGNETIC TUNNEL JUNCTION STRUCTURE AND MAGNETORESISTIVE ELEMENT USING THE SAME

TECHNICAL FIELD

The present invention relates to a ferromagnetic tunnel junction structure comprising a tunnel barrier layer disposed between two ferromagnetic layers, in particular to a spin-valve ferromagnetic tunnel junction structure in which the magnetization of one of the ferromagnetic layers is pinned by an antiferromagnetic layer and to a magnetoresistive element using the same.

BACKGROUND ART

In recent years, a Giant Magnetoresistance (GMR) effect element comprising a multilayer film of a ferromagnetic layer/non-magnetic metal layer and a ferromagnetic tunnel junction (MTJ) comprising a ferromagnetic layer/insulator layer/ferromagnetic layer have attracted attention for new magnetic field sensors and non-volatile magnetic random access memory (MRAM) cells. With respect to the GMR, there have been known a CIP-GMR of a type such that an electric current flows within the plane of the film and a CPP-GMR of a type such that an electric current flows in the direction perpendicular to the plane of the film. The principle of the GMR resides mainly in spin-dependent scattering at the interface between the ferromagnetic layer and the non-magnetic layer, but spin-dependent scattering in the ferromagnetic material (bulk scattering) also contributes to the principle. For this reason, generally, in the multilayer film, the CPP-GMR to which the bulk scattering is expected to contribute is larger than the CIP-GMR. For the practical use a spin valve type device has been used, in which an antiferromagnetic layer is disposed in the vicinity of one of the ferromagnetic layers to pin the spin of the ferromagnetic layer.

On the other hand, in the MTJ, by controlling the magnetization configurations of two ferromagnetic layers to be parallel or antiparallel to each other using an external magnetic field, a so-called tunnel magnetoresistance (TMR) effect in which the tunnel currents in the direction perpendicular to the planes of the films are different from each other can be obtained at room temperature. The TMR ratio in the tunnel junction depends on a spin polarization P at the interface between the ferromagnetic material and insulator used, and it is known that when spin polarizations of two ferromagnetic materials are respectively taken as $P_1$ and $P_2$, TMR ratio is generally given by the following Julliere's formula (1):

$$TMR = 2P_1P_2/(1-P_1P_2) \qquad (1)$$

A ferromagnetic material has a spin polarization P which satisfies the relationship: $0 < P \leq 1$. Also for the MTJ, a spin-valve structure in which an antiferromagnetic layer is kept adjacent to one ferromagnetic layer thereby pinning the spin of the ferromagnetic layer is in practical use.

As can be seen from the formula (1), when using a ferromagnetic material having a spin polarization $P=1$, an infinitely large TMR is expected. A magnetic material having $P=1$ is called a half-metal, and from the band calculations already made, oxides, such as $Fe_3O_4$, $CrO_2$, $(La-Sr)MnO_3$, $Th_2MnO_7$, and $Sr_2FeMoO_6$, half Heusler alloys, such as NiMnSb, full-Heusler alloys having an $X_2YZ$-type composition and having an $L2_1$ structure, such as $Co_2MnGe$, $Co_2MnSi$, and $Co_2GrAl$, and the like are known as half-metals. Above all, Co-based full-Heusler alloys with X=Co have a high Curie point and are therefore most expected for applications. Full-Heusler alloys have an disordered structure of a B2 or A2 (body-centered cubic) structure, in addition to the $L2_1$ ordered structure. In general, it is known that B2 structure also becomes a half-metal like $L2_1$ structure, however, A2 structure destroys half-metallicity. Heat treatment is necessary for obtaining the $L2_1$ and B2 structures; and for obtaining the B2 structure, in general, the substrate must be heated up to 200° C. or higher, or must be post-annealed at a temperature above 300° C. after film deposition at room temperature, though depending on the composition thereof. For obtaining the $L2_1$ structure, a higher temperature than that is needed.

Amorphous Al oxide (AlOx) films and (001)-oriented MgO films have been used for barrier materials in MTJ. The former are formed through film formation of Al metal according to a sputtering method followed by oxidation according to a method of plasma oxidation or the like, and it is well known that their structure is amorphous (Non-Patent Document 1). In the AlOx barrier, the interface roughness between the ferromagnetic layer and the barrier layer is generally large and the TMR variation is large, and in addition, a large TMR is difficult to be obtained; and therefore, recently, a crystalline MgO barrier has become much used. MgO barrier can be made by a method of direct sputtering from an MgO target, or a method of evaporation with an MgO shot using electron beams. However, in MTJ with a full-Heusler alloy, in general, a high-quality MgO barrier is difficult to be obtained; and therefore, an electron beam evaporation method is applied.

Up to date, as the Co-based half-metal full-Heusler alloys used for the magnetic layer in MTJ, there are known $Co_2MnSi$, $Co_2MnGe$, $Co_2Cr_{0.6}Fe_{0.4}Al$, $Co_2FeAl_{0.5}Si_{0.5}$, etc. Of those, the MTJ including $Co_2FeAl_{0.5}Si_{0.5}$ has the largest TMR at room temperature, in which the MgO barrier is formed using an electron beam evaporation method; and the room-temperature TMR of the MTJ having a spin-valve structure is 220% (Non-Patent Document 2).

As another method of obtaining large TMR not using a half-metal, there is known a method of utilizing a coherent tunnelling effect. An MgO barrier is used and its crystal is (001)-oriented, and the upper and lower ferromagnetic layers arranged to dispose the barrier therebetween are also (001)-oriented epitaxial tunnel junctions. In such a case, there occurs a coherent tunnelling effect of such that a $\Delta_1$ band electron having a large tunnelling transmission essentially contributes toward tunnel. It is known that, in this case, on the Fermi level of the ferromagnetic layer, when the $\Delta_1$ band exists in one spin band (for example, majority spin band) but does not exist in the other spin band (for example, minority spin band), TMR is greatly enhanced owing to the coherent tunnelling effect (Non-Patent Document 3). Up to now, as ferromagnetic materials with which great enhancement of TMR owing to the coherent tunnelling effect thereof has been reported, there are known bcc-crystalline structured Fe, Co, Fe—Co alloys and CoFeB alloys.

It has been theoretically pointed out that the coherent tunnelling effect is also effective for Co-based full-Heusler alloys, such as $Co_2MnSi$ (Non-Patent Document 4); and in fact, in MTJ including $Co_2MnSi$, the matter has been observed (Non-Patent Document 5) when MgO barrier was fabricated using an electron beam deposition. However, in case where a Co-based full-Heusler alloy is used as a ferromagnetic layer material, in general, the lattice misfit thereof with MgO is large, and therefore, especially when the MgO barrier is formed using a sputtering method, there occur many dislocations inside the MgO barrier and in the interface between the ferromagnetic layer and the MgO layer, and therefore a high-quality tunnel barrier could not be obtained;

and in addition, the Co-based full-Heusler alloy structure on the MgO barrier is often a disordered structure. In such a case, owing to the formation of the disordered structure at the interface, the lattice periodicity is broken and the tunnelling electron momentum in the direction perpendicular to the film surface could not be conserved, and therefore, the TMR enhancement owing to the coherent tunnelling effect as theoretically pointed out could not be observed. In other words, the TMR enhancement owing to the coherent tunnelling effect could not always be observed for all Co-based full-Heusler alloys.

The MTJ has currently been practically used in a magnetic read head for hard disk and a non-volatile magnetic random access memory MRAM. In the MRAM, MTJs are arranged in a matrix form and an electric current is allowed to flow a separately provided wiring to apply a magnetic field to the MTJ, so that two magnetic layers constituting each MTJ are controlled to be parallel or antiparallel to one another, thus recording data of 1 or 0. The recorded data is read utilizing a TMR effect. Recently, so-called spin-transfer magnetization switching has become important, which is for switching the MTJ magnetization by injection of spin polarization current; and one problem is how to reduce the critical current density necessary for the magnetization switching. The critical current density is smaller when the tunnel spin polarization of MTJ is larger; and use of MTJ with a larger TMR is desirable. In addition, the critical current density is proportional to the damping constant $\alpha$ of a ferromagnetic material, and therefore, a ferromagnetic material having a smaller $\alpha$ is desirable. Specifically, an MTJ including a ferromagnetic material having a small $\alpha$ as the electrode therein and capable of providing a large TMR is suitable for MRAM. On the other hand, as spintronics devices in future, a technique of spin injection into semiconductor via barrier has become much important in the field of spin MOSFET and spin transistors. In these fields, high-efficiency spin injection into semiconductor is needed, for which earnestly desired is a ferromagnetic material capable of gaining a large spin polarization current and a small critical current density for spin-transfer magnetization switching.

It is known that a Co-based full-Heusler alloy has a smaller a as compared with ordinary Fe-Co alloys (Non-Patent Document 6); and accordingly, desired is development of a Co-based full-Heusler alloy capable of providing a large TMR at room temperature for spintronics devices. Above all, $Co_2FeAl$ has a smallest $\alpha$ (Non-Patent Document 6), and therefore, its use is desired; however, since the alloy is not a half-metal (Non-Patent Document 7), a large TMR is not expected for it.

PRIOR ART DOCUMENTS

Patent Document

Patent Document 1: Japanese Patent No.4061590

Non-Patent Documents

Non-Patent Document 1: J. S. Moodera et al., Phys. Rev. Lett. 74, 3273 (1995).
Non-Patent Document 2: N. Tezuka et al., Jpn. J. Appl. Phys. 46, L454 (2007).
Non-Patent Document 3: W. H. Butler et al., Phys. Rev. B 63, 054416 (2001).
Non-Patent Document 4: Miura et al., J. Phys.: Condens. Matter 19, 365228 (2007).
Non-Patent Document 5: Y. Sakuraba et al., Appl. Phys. Lett. 88, 192508 (2006).
Non-Patent Document 6: Narumi Minakami et al., Magne Vol. 4, No. 5, 229 (2009).
Non-Patent Document 7: K. Inomata et al., J. Phys.D:Appl. Phys, 39, 816 (2006).
Non-Patent Document 8: S. Ishida et al., Mater. Trans. 45, 1065 (2004).
[Non-Patent Document 9] C. Tiusan et al., J. Phys.: Condens. Matter 18, 941 (2006).

SUMMARY OF THE INVENTION

Problems that the Invention is to Solve

In consideration of the situation as above, an object of the present invention is to attain a large TMR, especially a TMR over 100% at room temperature using $Co_2FeAl$ not a half-metal but having a smallest $\alpha$.

Means for Solving the Problems

The ferromagnetic tunnel junction structure of the invention 1 is characterized by using an MgO barrier and by using a $Co_2FeAl$ full-Heusler alloy for any of ferromagnetic layers.

The invention 2 is the ferromagnetic tunnel junction structure of the invention 1, wherein $Co_2FeAl$ includes especially a B2 structure.

The invention 3 is the ferromagnetic tunnel junction structure of the invention 1 or 2, wherein one of the ferromagnetic layers is formed on a Cr buffer layer.

The magnetoresistive element of the invention 4 is characterized in that the ferromagnetic tunnel junction structure therein is the ferromagnetic tunnel junction structure of any one of the inventions 1 to 3.

Effect of the Invention

In the process of studying MTJ elements using various types of Co-based full-Heusler alloy materials, the present inventors have found that in a combination thereof with an MgO barrier, $Co_2FeAl$ exhibits an extremely large TMR. Heretofore, $Co_2FeAl$ is not a half-metal as mentioned above, and when it has A2, B2 and $L2_1$ structures, the spin polarizability thereof is around 0.5, 0.6 and 0.8, respectively; and therefore, it has been considered that a giant TMR could not be expected for the alloy. In fact, the present inventors produced tunnel junction structures using amorphous $AlO_x$ barrier and $Co_2FeAl$, and have reported that their maximum TMR is 75% or so at low temperatures and 55% or so at room temperature (Patent Document 1, Non-Patent Document 8). However, an MTJ element using $Co_2FeAl$ and MgO barrier was not produced.

This time the inventors produced tunnel junction structures using $Co_2FeAl$ and MgO barrier and, surprisingly have found out a giant TMR over 300% at room temperature, and using it, the inventors have reached the present invention. The reason why such a giant TMR could be obtained is not clear at present, and detailed studied will be needed in future. It may be considered that, among Co-based full-Heusler alloys, $Co_2FeAl$ is a material having a larger lattice constant of 0.573 nm, and accordingly, the lattice misfit of the alloy with Cr and MgO is small, and a high-quality epitaxial tunnel junction with good lattice misfit can be obtained at the interface between the buffer layer and the barrier to thereby attain the coherent tunnelling effect more effectively.

In the invention, the giant TMR can be obtained even when the MgO barrier is formed using a sputtering method not through electron beam vapor deposition. This is a novel discovery no one could heretofore reach using Co-based Heusler alloys. Accordingly, the present tunnel junction structure can be produced even when only a sputtering apparatus is used, and any existing sputtering apparatus can be used for producing the structure, and the invention is applicable to HDD readout heads and MRAM. HDD includes a recording and readout head and a recording medium, and the tunnel junction structure of the invention can be used for readout magnetic heads. MRAM has a structure where tunnel junction structures stacked on MOSFET are arranged like matrices, and the tunnel junction structure of the present invention can be used for the tunnel junction structure therein.

The tunnel junction structure of the invention including $Co_2FeAl$ and MgO barrier can be used in many spintronics devices, for example, spin resonance tunnel elements including a ferromagnetic double-tunnel junction structure that are expected in future, ferromagnetic tunnel elements for use in spin logistic devices such as spin MOSFET or the like for which efficient spin injection into semiconductor is needed, etc. In addition, when a multilayered film of a thin $Co_2FeAl$ with a Pt film or a CoPt film or an FePt film is used, then perpendicular magnetization can be realized; and when a ferromagnetic tunnel junction with MgO as a barrier therein is produced using such a multilayered film, then a ferromagnetic tunnel junction structure can be constructed having the ability of perpendicular magnetization and capable of exhibiting a giant TMR. The tunnel junction element of the type can be utilized in gigabit-scale large-capacity MRAM.

MODE FOR CARRYING OUT THE INVENTION

Figure 1:
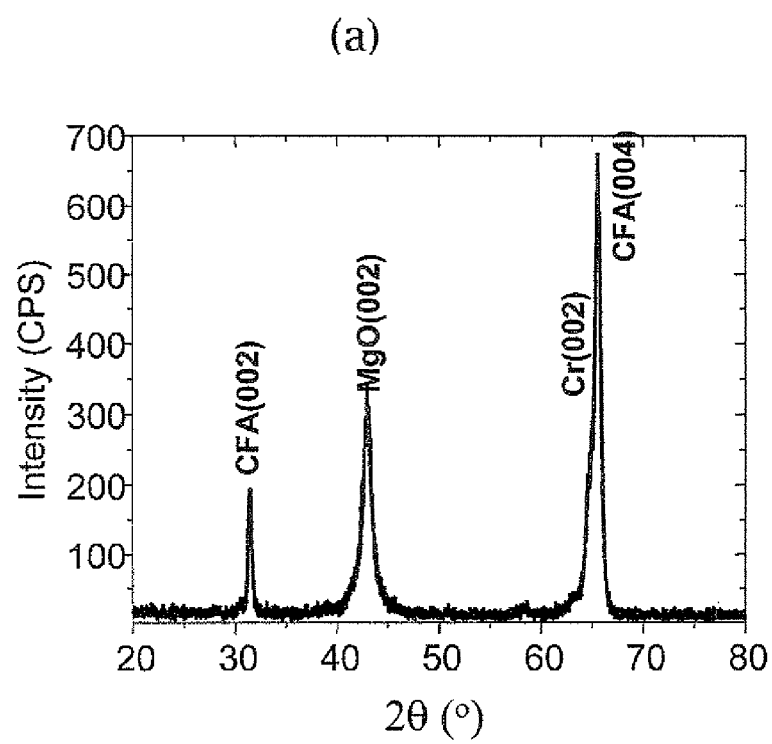
FIG. 1 shows X-ray diffraction patterns of a $Co_2FeAl$ thin film of the present invention, as formed on an MgO (001) substrate with a buffer Cr using a sputtering method and heat-treated at 480° C. (a) is a θ-2θ diffraction pattern and (b) is an in-plane (222) scan.
Figure 1:
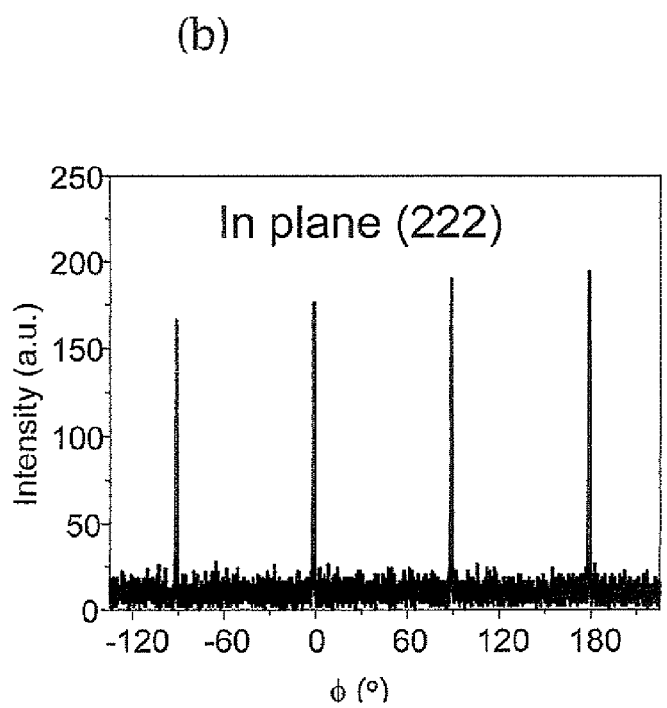

The inventors of the present application have found that when a magnetron sputtering apparatus is used and when MgO is used as a barrier and $Co_2FeAl$ full-Heusler alloy as a ferromagnetic layer, then an extremely large TMR can be obtained, and on the basis of this finding, the inventors have completed the present invention.

$Co_2FeAl$ provides a large TMR in any structure of A2, B2 or $L2_1$, but the structure B2 is preferred as providing the largest TMR.

The substrate to be used may be any one capable of forming a (001)-oriented epitaxial tunnel junction, and for example, preferred are MgO, non-magnetic spinel such as $MgAl_2O_4$, and single crystals of Si, GaAs or the like. As the substrate, also usable is thermally-oxidized Si. If desired, a buffer layer is formed on the substrate. As the buffer layer, preferred is one having good lattice-matched $Co_2FeAl$, for which usable is MgO, $MgAl_2O_4$, Cr, Ag, TiN or the like. Above all, Cr is preferred as facilitating the formation of a B2 structured $Co_2FeAl$ film, and facilitating the formation of a flat $Co_2FeAl$ film with high (001) orientation and good crystalline property. Ag alone could hardly form a flat film on the substrate, and therefore, when Ag is used, it is desirable that a Cr film is first formed on the substrate and then a flatter Ag film may be formed thereon. In case where a thermally-oxidized Si substrate is used, an MgO target may be sputtered thereonto under a film formation condition of a controlled Ar gas pressure and a controlled sputtering power, or an (001)-oriented MgO film may be previously grown using an electron beam evaporation method, and thereafter an epitaxial tunnel junction with a (001)-oriented $Co_2FeAl$ film may be formed thereon.

A lower magnetic layer, a buffer layer and an upper magnetic layer are formed sequentially in the manner mentioned below. The following shows a top-pin case having an antiferromagnetic layer formed at the top thereof.

First, the roughness of the lower magnetic layer is reduced, and a buffer layer for promoting epitaxial growth is formed. As the buffer layer, preferred is Cr, MgO or the like. Next, on this, a full-Heusler alloy $Co_2FeAl$ (hereinafter referred to as CFA) thin film to be a lower magnetic layer is formed at room temperature. Subsequently, at a temperature of from 400 to 650° C. or so, this is processed for in-situ heat treatment to give a B2 or $L2_1$-structure CFA film. In this case, at around 600° C. or lower, the B2 structure is formed; and at a temperature higher than 600° C., the $L2_1$ structure is formed. The thickness of the lower magnetic layer may be such that the layer grows epitaxially and is a ferromagnetic layer having a small degree of roughness, and for example, the thickness if preferably from 10 to 80 nm or so.

At the heat treatment temperature at which the $L2_1$ structure is formed, the surface roughness may increase more; and for obtaining a giant TMR, the B2 structure having a smaller surface roughness is preferred. In the case with no heat treatment, or in the case with heat treatment at 300° C. or lower, the A2 structure, or a combination of the B2 and A2 structures is formed depending on the substrate. In those cases, TMR is smaller than that in the case of forming the B2 structure; however, at room temperature, TMR of not lower than 100% can be obtained, or that is, the heat treatment temperature may be low, and therefore the A2 structure is also effective in some applications.

Next, on the bottom magnetic layer, an MgO layer serving as a barrier layer is formed. For the formation method, an MgO target may be sputtered, or an MgO shot may be evaporated to the layer using electron beam deposition. Regarding the thickness of the barrier layer, the minimum thickness thereof may be such that a crystalline, epitaxially-grown MgO layer can be formed, and the maximum thickness thereof may be determined depending on the necessary junction resistance. In general, for example, the thickness is preferably from 0.5 to 4 nm or so.

Next, on the tunnel barrier layer, formed is a film of CFA or a CoFe alloy or a CoFeB alloy to be a (001)-oriented thin film thereon as the upper magnetic layer. In that manner, a (001)-oriented epitaxial tunnel junction can be constructed as a whole. The thickness of the upper magnetic layer may be on the same level as that of the film thickness set in spin-valve type, ferromagnetic tunnel junction structures heretofore proposed in the art in which the magnetization of one ferromagnetic layers is pinned by an antiferromagnetic layer; and for example, the thickness is preferably from 3 to 20 nm or so.

For the film formation method, also employable herein are any ordinary thin film formation methods such as an evaporation method, an MBE method, a laser ablation method, etc., in addition to the sputtering method Examples of the present invention are described below.

EXAMPLE 1

Using a magnetron sputtering apparatus, a Cr(40)/Co$_2$FeAl(30) stacked film was formed on an MgO (001) substrate, using a Cr film as the buffer layer therein. The parenthesized numerical value means the film thickness of the layer (unit, nm); and the same shall apply hereinunder. Afterwards, for bettering the crystalline property of the Co$_2$FeAl (CFA) film, the film was heat-treated at a temperature of 480° C. for 1 hour. X-ray diffraction thereof revealed that CFA in that condition had a B2 structure. Subsequently, an MgO target was sputtered to form an MgO barrier having a thickness of 1.8 nm. Further subsequently, a CoFe(2)/IrMn(12)/Ru(7) stacked film was formed at room temperature, thereby producing a spin-valve type tunnel junction structure. IrMn is an antiferromagnetic material, and has a role of pinning the spin of the upper CoFe ferromagnetic layer. Ru is a protective film and serves as a mask in microfabrication.

Afterwards, the stacked film was microfabricated to a size of 10 μm×10 μm through photolithography and ion-milling. Next, with applying a magnetic field of 5 kOe thereto, the entire stacked film was heat-treated at different temperatures ($T_a$) thereby adding uniaxial anisotropy to the upper magnetic CoFe layer. An external magnetic field was applied to the junction structure, and the structure was analyzed for the characteristics thereof such as the temperature-dependent magnetoresistance change and others, and the found data are shown in Table 1.

TABLE 1

| EXPERIMENT NUMBER | HEAT TREATMENT TEMPERATURE $T_a$ (° C.) | TMR (%) 10K | TMR (%) 150K | TMR (%) 300K | BIAS VOLTAGE $V_h$ (V) |
|---|---|---|---|---|---|
| 1-01 | 300 | — | | 110 | 1 mV |
| 1-02 | 330 | — | | 125 | 1 mV |
| 1-03 | 360 | — | | 140 | 1 mV |
| 1-04 | 380 | — | | 180 | 1 mV |
| 1-05 | 400 | — | | 220 | 1 mV |
| 1-06 | 420 | — | | 265 | 1 mV |
| 1-07 | 430 | — | | 310 | 1 mV |
| 1-08 | 440 | — | | 330 | 1 mV |
| 1-09 | 450 | 701 | 490 | 330 | 1 mV |
| 1-10 | 460 | | | 320 | 1 mV |

FIG. 1 shows a θ-2θ X-ray diffraction pattern (a) and an in-plane (222) φ scan pattern (b) of the MgO (001) substrate/Cr(40)/CFA(30) stacked film, as heat-treated at 480° C. for 1 hour, corresponding to the lower electrode of the above-mentioned tunnel junction structure.

In (a), (002) and (004) diffraction lines corresponding to the B2 structure of CFA are seen in addition to the MgO (002) and Cr (002) diffraction lines; and in (b), four fold symmetry patterns of (222) are seen. From these, it is known that CFA has a B2 structure and has epitaxially grown. In addition, since the half-value width of the diffraction line is small and since extremely sharp diffraction lines are obtained, it is known that the (002) orientation degree of B2 is extremely high. In this connection, the in-plane (111) φ scan corresponding to L2$_1$ was analyzed, in which, however, no diffraction pattern was seen. Accordingly, the produced Co$_2$FeAl film has a B2 structure.

Figure 2:
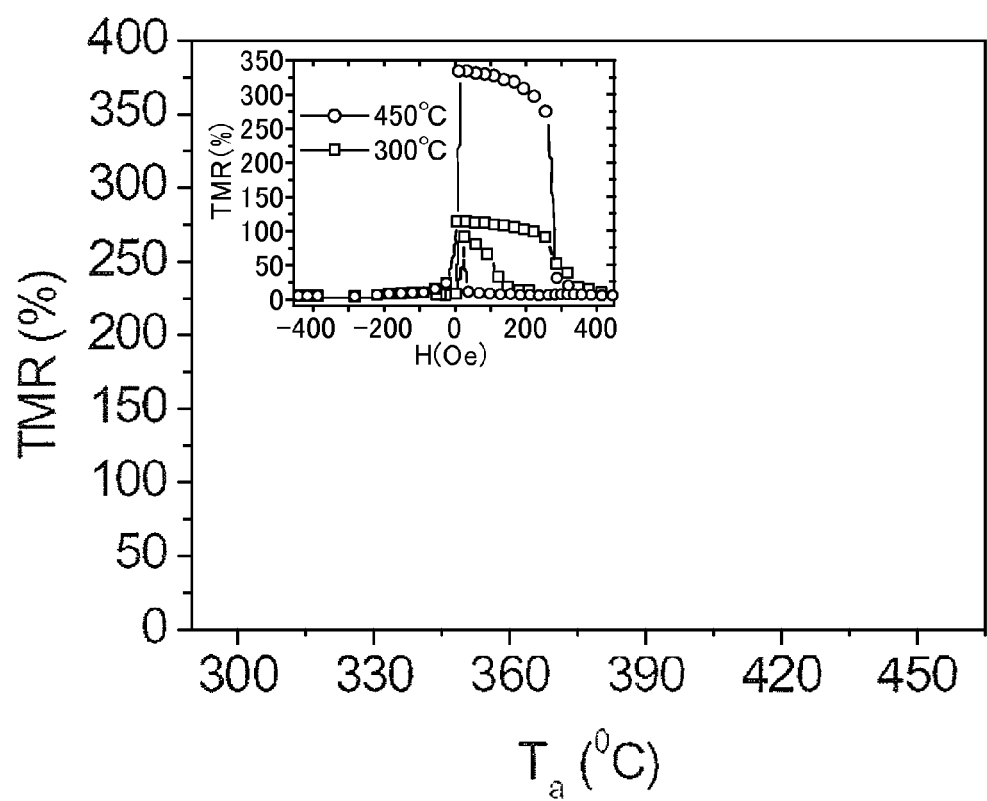
FIG. 2 shows the annealing temperature dependence in a magnetic field of the tunnel magnetoresistance (TMR) of the tunnel junction structure of the invention. The inserted figure includes TMR curves at an annealing temperature of 300° C. and 450° C.
Figure 3:
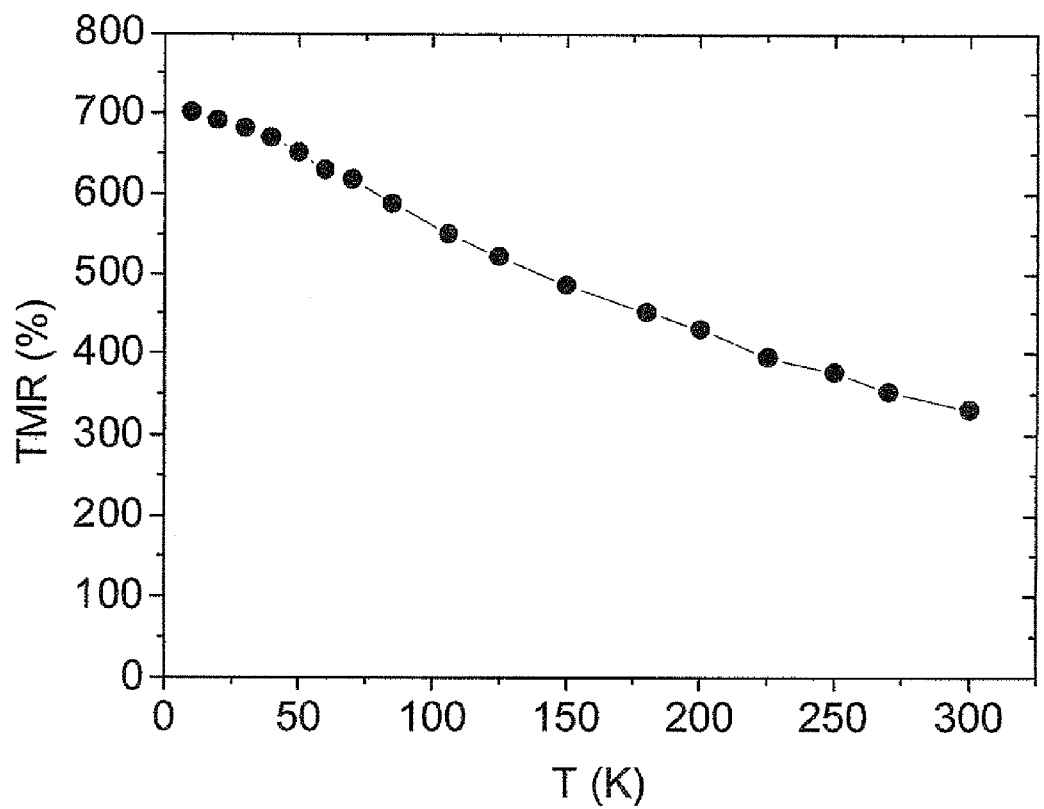
FIG. 3 shows the temperature dependence of TMR for the magnetic tunnel junction of the invention.

Next, FIG. 2 shows the heat treatment temperature ($T_a$) dependence in a magnetic field of TMR at room temperature of the magnetic tunnel junction. At $T_a$=300° C., a large TMR over 100% was already obtained; and TMR rapidly increased with the elevation of the heat treatment temperature. At $T_a$=450° C., a giant value of 330% was obtained. The value is over the maximum value 220% that has heretofore been obtained in MTJ using a Co-based Heusler alloy. The inserted figure includes TMR curves at $T_a$=300° C. or 450° C. or at room temperature. All these are asymmetric spin-valve type curves, indicating the pinning of the magnetization of the upper ferromagnetic layer with the antiferromagnetic IrMn in the structure. FIG. 3 shows the temperature-dependent TMR change at $T_a$=450° C. At 10K, a giant TMR of 701% was obtained.

Figure 4:
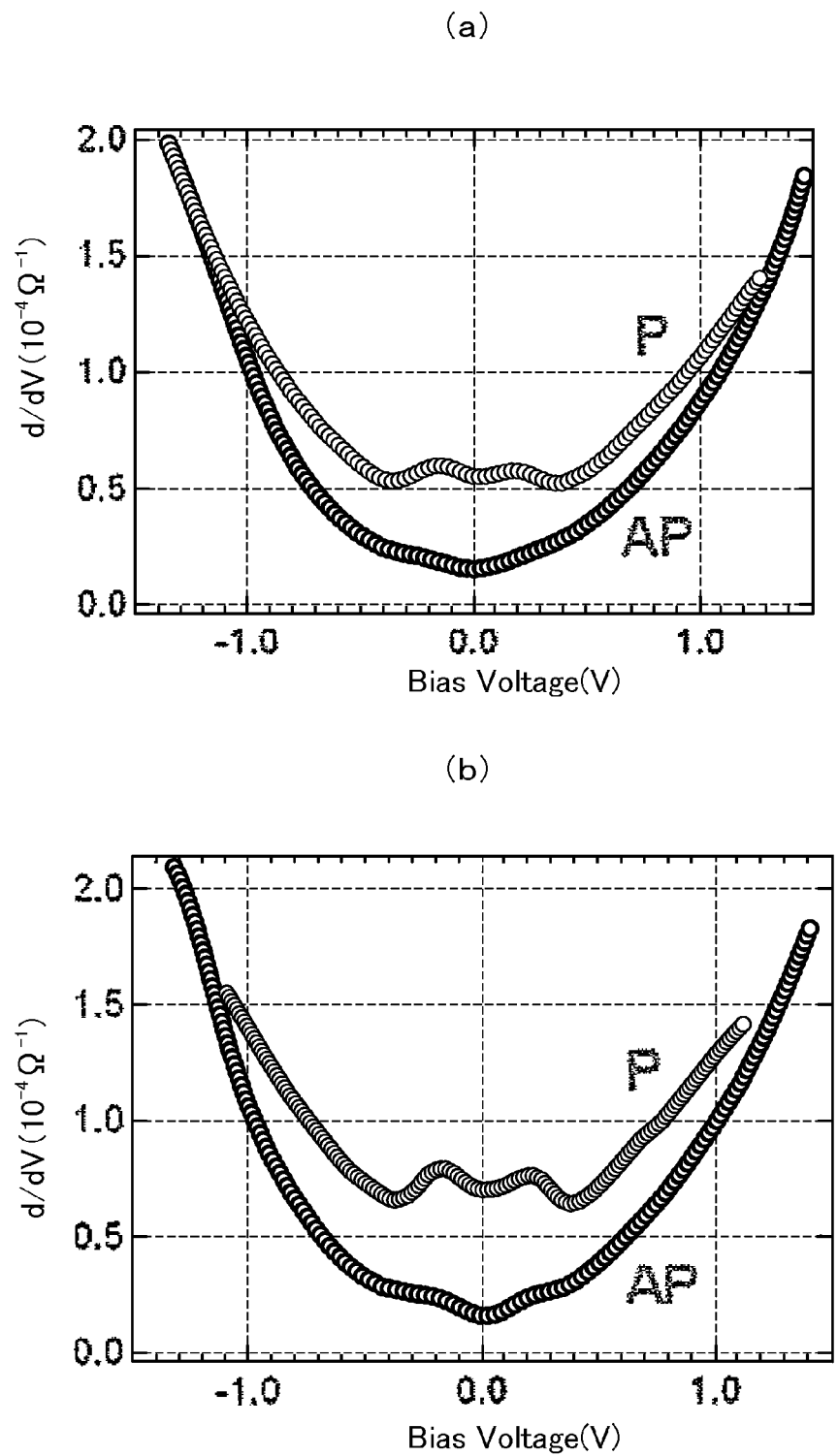
FIG. 4 shows the bias voltage dependence of TMR at room temperature for the magnetic tunnel junction the invention.
Figure 5:
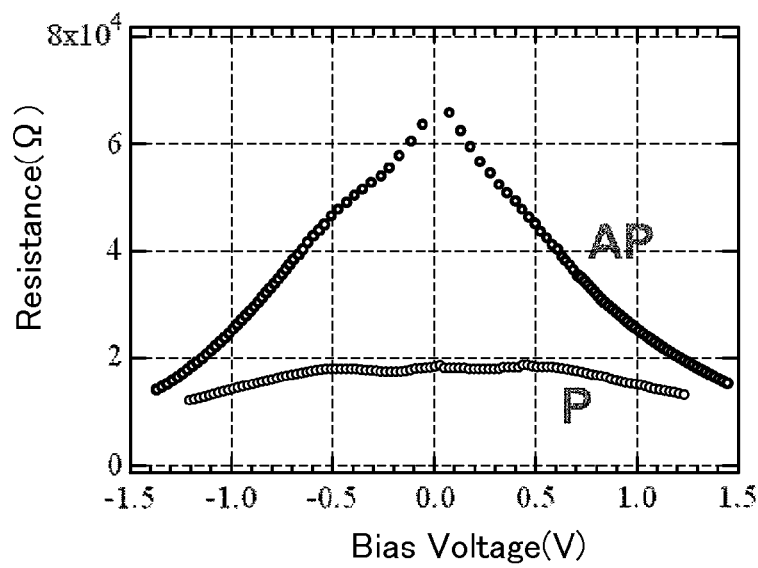
FIG. 5 shows the bias voltage dependence of the differential conductance at room temperature (a) and at 10K (b) for the magnetic tunnel junction of the invention.
Figure 5:
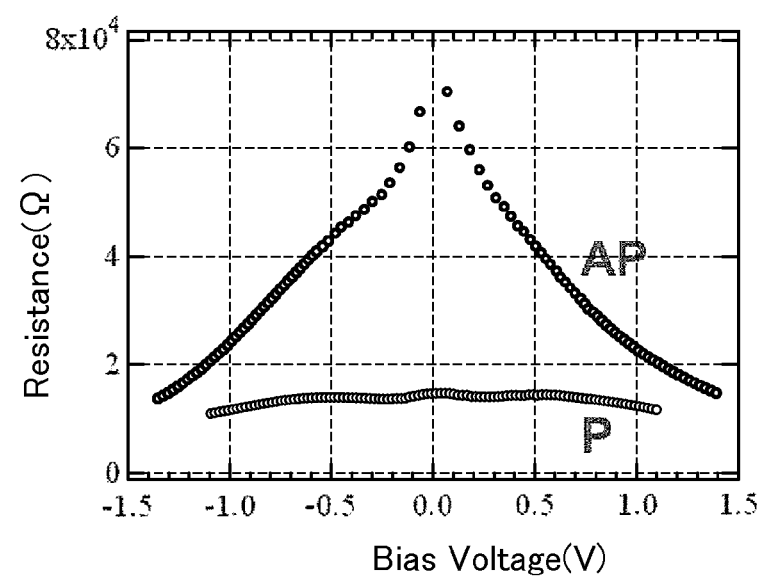

For clarifying the reason of providing such a giant TMR, the samples were analyzed for the bias voltage dependence of the differential conductance dI/dV thereof. The results at $T_a$=450° C. is shown in FIGS. 4(a) and (b). (a) shows the results at room temperature; and (b) shows the results at 10K. These shows the data of two cases where the magnetizations of the upper and lower magnetic layers are in parallel (P) or in antiparallel (AP) to each other. In P, dI/dV shows a clear minimum at around +0.4V and −0.3V both at room temperature and low temperature. The minimum is based on the electron structure of the ferromagnetic layer, and is a phenomenon well seen in a case of providing a coherent tunnel (Non-Patent Document 9). Accordingly, the obtained giant TMR is considered because of the coherent tunnel effect. FIG. 5 shows the bias voltage dependence of the resistance at $T_a$=450° C. (a) shows the data at room temperature, and (b) shows the data at 10K. These shows the data of two cases where the magnetizations of the upper and lower magnetic layers are in parallel (P) or in antiparallel (AP) to each other. The resistance in the parallel condition shows the minimum at around +0.4V and −0.3V. The resistance minimum has heretofore been not seen in existing tunnel junction structures using CFA, and has been seen herein for the first time. Accordingly, it can be said that the ferromagnetic tunnel junction structure of the present invention has a characteristic that heretofore existing ones could not have.

Figure 6:
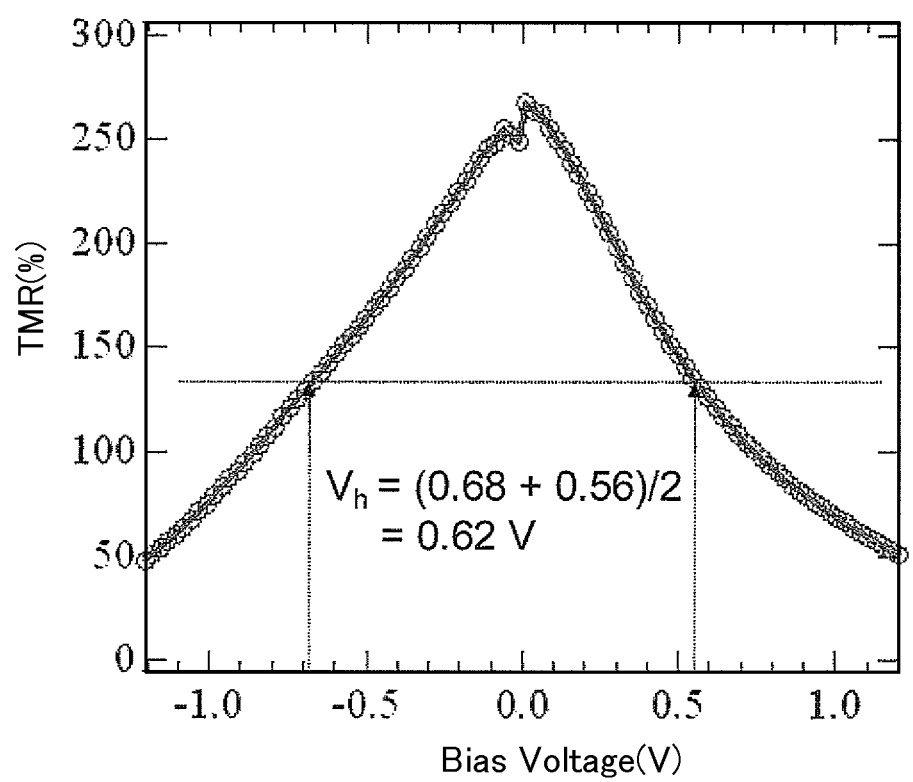
FIG. 6 shows the bias voltage dependence of the resistance at room temperature (a) and at 10K (b) for the magnetic tunnel junction of the invention.

FIG. 6 shows the bias voltage dependence of TMR at room temperature. The bias voltage $V_h$ at which TMR decreases by half is 0.62 V on average and is relatively large, or that is, this is more than two times that of the case where an existing Co-based full-Heusler alloy is used, about 0.3V. Accordingly, it can be said that the practicability of the tunnel junction structure of the invention is great.

EXAMPLE 2

A ferromagnetic tunnel junction structure of MgO(001) substrate/MgO(10)/CFA(30)/MgO(2)/CoFe(2)/IrMn(10)/Ru(7) was produced according to the same method as in Example 1, except that an MgO buffer was used in place of the Cr buffer, and was evaluated in point of the TMR characteristics thereof. As a result, a highest TMR of 150% at room temperature was obtained, though smaller than that in the case of using the Cr buffer layer.

EXAMPLE 3

Figure 7:
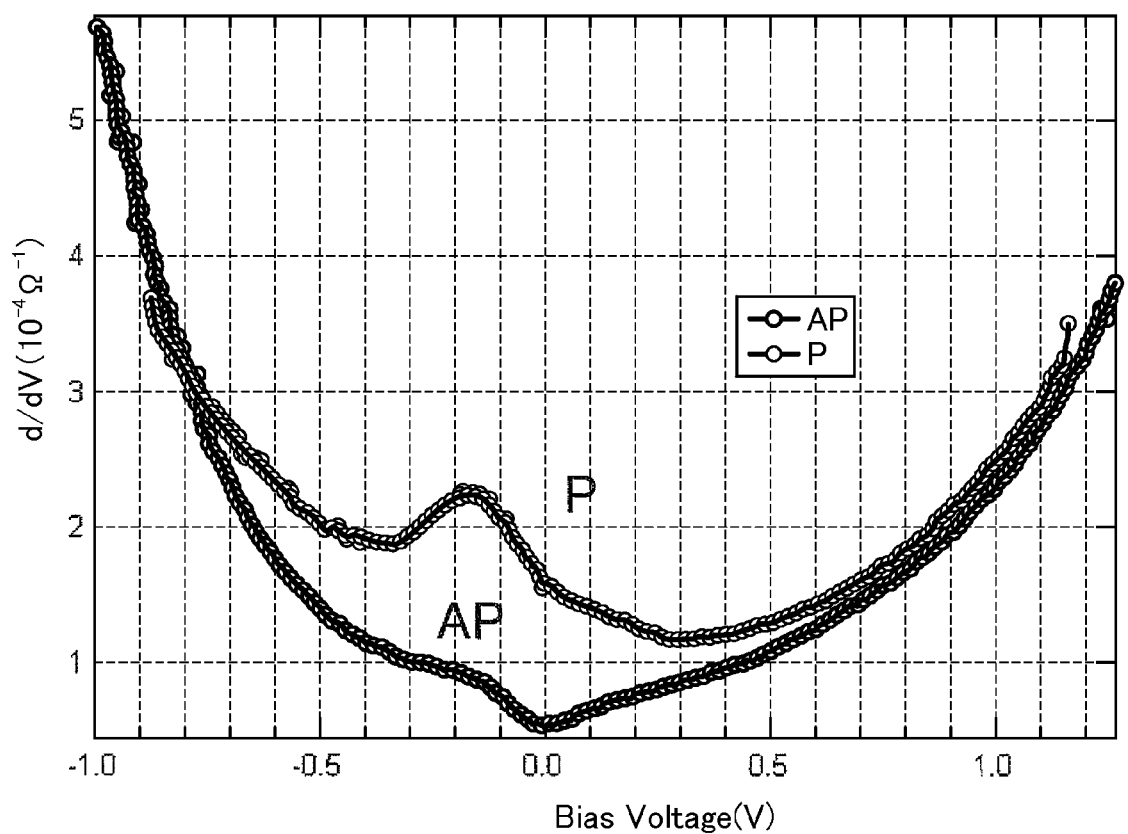
FIG. 7 shows the bias voltage dependence of the differential conductance at room temperature for the magnetic tunnel junction of the invention in which a $Co_2FeAl$ thin film is used as the upper and lower electrodes.

A ferromagnetic tunnel junction structure of Cr(40)/CFA(30)/MgO(1.8)/CFA(5)/CoFe(3)/IrMn(12)/Ru(7) was produced according to the same method as in Example 1, in which CFA was used for both the lower and upper magnetic layers. In this case, $T_a = 400°$ C. As a result of measurement of TMR, a large TMR of 188% at room temperature and 310% at 10K was obtained. The reason why TMR herein is smaller than that in Example 1 is not clear at present; however, the reason may be because the degree of (100) orientation of the upper CFA on the MgO barrier is not sufficient like that in Example 1, and the interfacial structure between the upper CFA and MgO is not ideal, and therefore it may be considered that the contribution of the coherent tunnel effect could not be on the same level as that in Example 1. In fact, as shown in FIG. 7, the bias dependence of differential conductance dI/dV showed the minimum only on one side (negative side), and obviously different from FIG. 4, a coherent tunnel did not occur between the upper CFA layer and the MgO barrier layer. However, by improving the (001) orientation and the above-mentioned interface structure, a further larger TMR could be expected than in the case where CoFe was used as the upper layer.

EXAMPLE 4

A ferromagnetic tunnel junction structure of Cr(40)/$Co_2FeAl_{0.25}Si_{0.75}$(30)/MgO(1.8)/CFA(5)/CoFe(3)/IrMn(12)/Ru(7) was produced according to the same method as in Example 1, in which an alloy $Co_2FeAl_{0.25}Si_{0.75}$ was used for the lower magnetic layer. In this case, $T_a = 400°$ C. As a result of measurement thereof, TMR on the same level as in Example 3, or that is, a large TMR of 140% at room temperature was obtained.

EXAMPLE 5

A 10-nm MgO film was formed on an Si oxide substrate, and a ferromagnetic tunnel junction structure of CFA(30)/MgO (1.8)/CoFe(5)/IrMn(12)/Ru(7) was produced according to the same method as in Example 1. As a result of measurement thereof, TMR of 110% at $T_a = 300°$ C. and 180% at $T_a = 450°$ C. was obtained at room temperature. Such a large TMR was obtained when the thermally-oxidized Si substrate not a single-crystal substrate was used, and this may be considered because the MgO film was (001)-oriented and the coherent tunnel effect could act more effectively.

The invention claimed is:

1. A spin-valve type epitaxial tunnel junction structure exhibiting a coherent tunneling effect comprising a stacked film comprising a tunnel barrier layer sandwiched between two ferromagnetic layers wherein:
    the magnetization of one of the ferromagnetic layers is pinned by an antiferromagnetic layer,
    the junction structure is a (001)-oriented epitaxial tunnel junction structure in which the tunnel barrier layer is MgO and at least one of the ferromagnetic layers is B2-structure $Co_2FeAl$ Heusler alloy, and
    the stacked film comprised of the above layers has been subjected to a heat treatment at a temperature of from 400 to 600° C., so as to exhibit a coherent tunneling effect.

2. The epitaxial tunnel junction structure according to claim 1, wherein one of the ferromagnetic layers is B2-structure $Co_2FeAl$ Heusler alloy, and the other ferromagnetic layer is B2-structure $Co_2FeAl$ Heusler alloy or an A2-structure ferromagnetic layer.

3. The epitaxial tunnel junction structure according to claim 2, wherein one of the $Co_2FeAl$ Heusler alloy layers is formed on a buffer layer of Cr.

4. A magnetoresistive element comprising the epitaxial tunnel junction structure of claim 3.

5. A magnetoresistive element comprising the epitaxial tunnel junction structure of claim 2.

6. The epitaxial tunnel junction structure according to claim 1, wherein one of the B2-structure $Co_2FeAl$ Heusler alloy layers is formed on a buffer layer of Cr.

7. A magnetoresistive element comprising the epitaxial tunnel junction structure of claim 6.

8. A magnetoresistive element comprising the epitaxial tunnel junction structure of claim 1.

9. The epitaxial tunnel junction structure according to claim 1, having a tunnel magnetoresistance of greater than 220% at room temperature.

* * * * *